United States Patent
Inoue

(10) Patent No.: US 10,304,756 B2
(45) Date of Patent: May 28, 2019

(54) POWER SEMICONDUCTOR MODULE AND COOLER

(71) Applicant: FUJI ELECTRIC CO., LTD., Kawasaki-shi, Kanagawa (JP)

(72) Inventor: Daisuke Inoue, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/608,448

(22) Filed: May 30, 2017

(65) Prior Publication Data
US 2017/0271240 A1 Sep. 21, 2017

Related U.S. Application Data

(63) Continuation of application No. PCT/JP2016/064457, filed on May 16, 2016.

(30) Foreign Application Priority Data

Jun. 17, 2015 (JP) ................... 2015-121831

(51) Int. Cl.
*H01L 23/34* (2006.01)
*H01L 23/473* (2006.01)
(Continued)

(52) U.S. Cl.
CPC ............ *H01L 23/473* (2013.01); *H01L 23/24* (2013.01); *H01L 23/3735* (2013.01);
(Continued)

(58) Field of Classification Search
CPC ............... H01L 23/473; H01L 23/4006; H01L 23/3675; H01L 25/18; H01L 25/07;
(Continued)

(56) References Cited

U.S. PATENT DOCUMENTS 6,216,343 B1 * 4/2001 Leland ................ B21C 37/225
29/890.03
7,042,725 B2 * 5/2006 Martin ................ H01L 23/473
165/80.4
(Continued)

FOREIGN PATENT DOCUMENTS

CN 104425406 A 3/2015
JP H08-145589 A 6/1996
(Continued)

OTHER PUBLICATIONS

Japan Patent Office, "Office Action for Japanese Patent Application No. 2017-524734," dated Feb. 27, 2018.
(Continued)

*Primary Examiner* — Vu A Vu
(74) *Attorney, Agent, or Firm* — Manabu Kanesaka

(57) ABSTRACT

A power semiconductor module includes a laminate substrate; a semiconductor element joined to a front surface of the laminate substrate; a base plate 14 joined to a rear surface of the laminate substrate; a cooling case 15 which 15 has a heat sink 17, a bottom wall 15a, a side wall 15b formed around the bottom wall 15a, an inlet portion 15c and an outlet portion 15d for a cooling-liquid which are connected to either the bottom wall 15a or the side wall 15b, in which one end of the side wall 15b is joined to a rear surface of the base plate 14 such that a cooling liquid can flow into a space surrounded by the base plate 14, the bottom wall 15a, and the side wall 15b. The power semiconductor module further includes a spacer 20 between the inlet portion 15c and the outlet portion 15d.

16 Claims, 8 Drawing Sheets

(51) Int. Cl.
*H01L 25/07* (2006.01)
*H01L 25/18* (2006.01)
*H01L 23/24* (2006.01)
*H01L 23/373* (2006.01)

(52) U.S. Cl.
CPC .............. *H01L 25/07* (2013.01); *H01L 25/18* (2013.01); *H01L 2924/181* (2013.01)

(58) Field of Classification Search
CPC ....... H01L 23/3735; H01L 2224/49113; H01L 2224/49111; H01L 2924/181; H05K 7/20
USPC ........................................................ 257/714
See application file for complete search history.

(56) References Cited

U.S. PATENT DOCUMENTS

| | | | | |
|---|---|---|---|---|
| 8,064,198 | B2* | 11/2011 | Higashidani | H05K 7/20927 165/104.19 |
| 9,204,573 | B2* | 12/2015 | Tanaka | H02M 7/53 |
| 9,585,292 | B2* | 2/2017 | Horiuchi | H05K 7/20927 |
| 2006/0032251 | A1 | 2/2006 | Wakita et al. | |
| 2008/0179972 | A1 | 7/2008 | Aoki et al. | |
| 2015/0061112 | A1 | 3/2015 | Bogen et al. | |
| 2016/0129792 | A1 | 5/2016 | Gohara et al. | |
| 2016/0370128 | A1* | 12/2016 | Agata | F28F 3/027 |

FOREIGN PATENT DOCUMENTS

| | | |
|---|---|---|
| JP | H08-271170 A | 10/1996 |
| JP | 2004-184057 A | 7/2004 |
| JP | 2006-100293 A | 4/2006 |
| JP | 2008-186820 A | 8/2008 |
| JP | 2008-294128 A | 12/2008 |
| JP | 2011-134979 A | 7/2011 |
| JP | 2013-153116 A | 8/2013 |
| JP | 2014-166080 A | 9/2014 |
| JP | 2014-179563 A | 9/2014 |
| JP | 2015-050465 A | 3/2015 |
| WO | 2015/079643 A1 | 6/2015 |

OTHER PUBLICATIONS

PCT/ISA/210, "International Search Report for International Application No. PCT/JP2016/064457," dated Jul. 26, 2016.
China Patent Office, "Office Action for Chinese Patent Application No. 201680003918.9," dated Oct. 12, 2018.

* cited by examiner

POWER SEMICONDUCTOR MODULE AND COOLER

CROSS-REFERENCE TO RELATED APPLICATIONS

This application is a continuation of PCT Application No. PCT/JP2016/064457, which claims priority to Japanese Patent Application No. 2015-121831, filed Jun. 17, 2015. The contents of these applications are incorporated herein by reference in their entirety.

TECHNICAL FIELD

The present invention relates to a power semiconductor module including a cooler for cooling a semiconductor element, and the cooler.

BACKGROUND ART

In devices using motors, which are typified by hybrid vehicles, electric vehicles, and the like, power converters are used for saving energy. For the power converters, power semiconductor modules are widely used. The power semiconductor modules include power semiconductor elements for controlling a large current.

The power semiconductor elements have a large calorific value when controlling a large current. In addition, downsizing and lightening are required for the power semiconductor modules, and the output density tends to be increased. Thus, in a power semiconductor module including a plurality of power semiconductor elements, a cooling method of the power semiconductor elements influences the power conversion efficiency.

In order to improve the cooling efficiency of a power semiconductor module, there is a power semiconductor module including a liquid-cooled cooler, in which power semiconductor elements are cooled by the cooler. The cooler of the power semiconductor module includes a metal base plate that transfers generated heat of the power semiconductor elements, a heat sink joined to a rear surface of the metal base plate, and a cooling case joined to the metal base plate and housing the heat sink, and has a structure in which a cooling liquid can flow into a space in the cooling case through an inlet and an outlet formed on the cooling case (Patent Document 1). The metal base plate, the heat sink, and the cooling case are joined by brazing (Patent Document 2).

RELATED ART DOCUMENTS

Patent Documents

Patent Document 1: JP 2006-100293 A
Patent Document 2: JP 2014-179563 A

SUMMARY OF THE INVENTION

Problems to be Solved by the Invention

The cooling efficiency of the cooler can be improved by adjusting the pressure distribution of the cooling liquid in the cooling case to an appropriate state. However, in the conventional power semiconductor module, the pressure distribution of the cooling liquid between the inlet and the heat sink, and between the heat sink and the outlet was disturbed, and the cooling performance was sometimes decreased. For example, in the case of a cooler including an inlet and an outlet on one side of a boxlike cooling case, a part of the cooling liquid did not flow in a flow passage in the heat sink and directly flowed from the inlet to the outlet through a gap between the heat sink and a side wall of the cooling case, and thus, the pressure distribution of the cooling liquid in the cooling case was disturbed.

Since the cooling case is molded by drawing, when performing the drawing such that the side wall has a shape that makes the gap between the heat sink and the side wall of the cooling case small, the cooling case is enlarged due to constraints on processing, and furthermore, the number of processing steps is increased, thereby increasing the manufacturing cost.

In particular, for power semiconductor modules mounted on vehicles, downsizing, thinning, and lightening are strongly required, and thus, enlarging of the cooling case is not preferable.

The present invention has been made in view of the foregoing points, and an object of the present invention is to provide a power semiconductor module and a cooler that can adjust the pressure distribution of a cooling liquid between an inlet and a heat sink, and between the heat sink and an outlet of the cooler of the power semiconductor module and improve the cooling efficiency.

Means for Solving the Problems

In order to achieve the above-described object, one mode of the present invention is the following power semiconductor module.

The power semiconductor module includes a laminate substrate; a semiconductor element joined to a front surface of the laminate substrate; a base plate joined to a rear surface of the laminate substrate; a cooling case; and a heat sink housed in the cooling case. The cooling case has a bottom wall and a side wall formed around the bottom wall, and has an inlet portion and an outlet portion for a cooling-liquid which are connected to either the bottom wall or the side wall, one end of the side wall being joined to a rear surface of the base plate such that a cooling liquid can flow into a space surrounded by the base plate, the bottom wall, and the side wall. The power semiconductor module further includes a spacer between the inlet portion and the outlet portion of the cooling case.

Another mode of the present invention is the following cooler.

The cooler includes a base plate; a cooling case; and a heat sink housed in the cooling case. The cooler has a bottom wall and a side wall formed around the bottom wall, and has an inlet portion and an outlet portion for a cooling-liquid which are connected to either the bottom wall or the side wall, in which one end of the side wall is joined to a rear surface of the base plate such that a cooling liquid can flow into a space surrounded by the base plate, the bottom wall, and the side wall. The cooler further includes a spacer between the inlet portion and the outlet portion of the cooling case.

Effects of the Invention

According to the power semiconductor module of the present invention, the pressure distribution of the cooling liquid between the inlet and the heat sink, and between the heat sink and the outlet of the cooler of the power semiconductor module is optimized, and the cooling efficiency can be improved.

MODE FOR CARRYING OUT THE INVENTION

Embodiments of a power semiconductor module of the present invention will be specifically described using the drawings. The terms indicating directions, such as "upper", "lower", "bottom", "front", and "back", which will appear in the following description, are used by referring to directions in the attached drawings.

Embodiment 1

Figure 1:
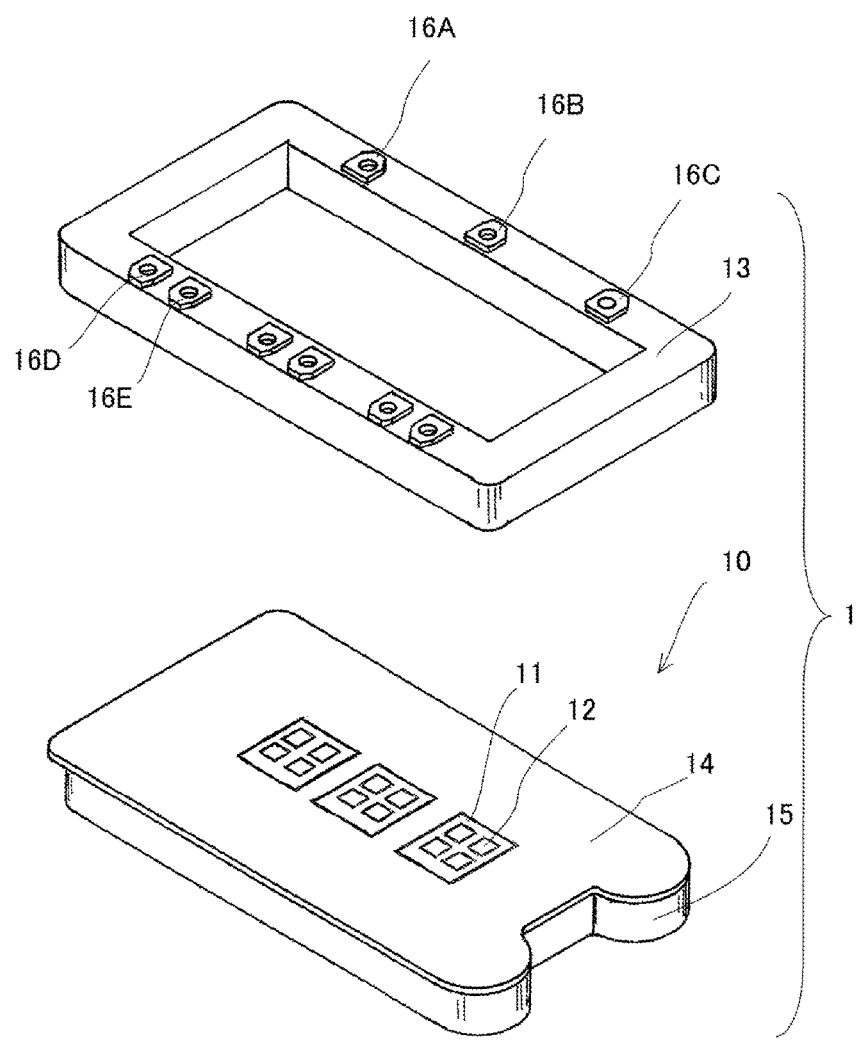
FIG. 1 is an exploded perspective view of one embodiment of a power semiconductor module of the present invention.

FIG. 1 is an exploded perspective view of one embodiment of the power semiconductor module of the present invention. A power semiconductor module 1 illustrated in FIG. 1 includes an insulating substrate 11 as a specific example of a laminate substrate, a semiconductor chip 12 joined to a front surface of the insulating substrate 11, a resin case 13 having a frame shape, which surrounds the insulating substrate 11 and the semiconductor chip 12, a metal base plate 14 as a specific example of a base plate, which is joined to a rear surface of the insulating substrate 11, and a cooling case 15 joined to a rear surface of the metal base plate 14.

In the illustrated present embodiment, three insulating substrates 11 are arranged in a row along a long direction at the center of a short direction of the metal base plate 14. In the respective insulating substrates 11, semiconductor chips 12 are mounted on one insulating substrate 11. Each of the semiconductor chips 12 of the illustrated present embodiment is an example of a reverse conducting IGBT (RC-IGBT) obtained by making an IGBT and a FWD into one chip, and four semiconductor chips 12 are arranged on one insulating substrate 11 in the illustrated example. The semiconductor chip 12 is not limited to the reverse conducting IGBT, and an IGBT and a FWD are respectively mounted on one insulating substrate 11. In addition, the switching element is not limited to the IGBT, and may be a MOSFET or the like. For a substrate of the semiconductor chip 12, a wide-band-gap material, such as silicon carbide, gallium nitride, or diamond, is also used in addition to silicon.

Figure 2:
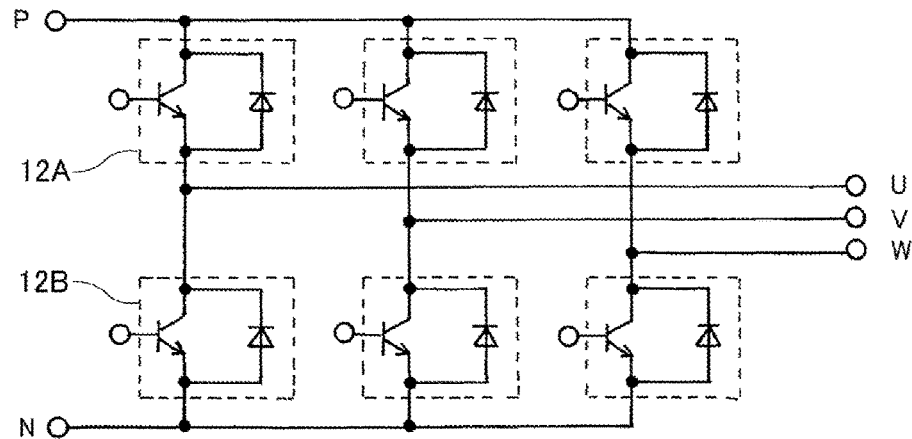
FIG. 2 is a circuit diagram of the power semiconductor module of FIG. 1.

FIG. 2 illustrates a circuit diagram of the power semiconductor module of FIG. 1. The power semiconductor module 1 is an example of a 6-in-1 type power semiconductor module configuring an inverter circuit. The three insulating substrates 11 on the metal base plate 14 configure a U phase, a V phase, and a W phase of the inverter circuit. In addition, in the four semiconductor chips 12 on one insulating substrate 11, two pairs, in total, of a pair of two semiconductor chips 12 electrically connected in parallel configure an upper arm and a lower arm in one phase configuring the inverter circuit.

The resin case 13 is made of an insulating resin, such as PPS (polyphenylene sulfide) resin or a urethane resin, and has a frame shape having an opening at the center, which penetrates from an upper surface to a bottom surface. The bottom surface of the resin case 13 is joined to a front surface of the metal base plate 14 with an adhesive. Ends of external terminals 16A to 16E protrude along a periphery of the upper surface of the resin case 13. Among these, the external terminal 16A, the external terminal 16B, and the external terminal 16C arranged on one of an outer edge in a long direction of the resin case 13 are a U terminal, a V terminal, and a W terminal, respectively. In addition, the external terminal 16D and the external terminal 16E arranged on the other of the outer edge in the long direction of the resin case 13 are a P terminal and an N terminal, respectively. The external terminals 16A to 16E are integrally attached to the resin case 13 by insert molding or the like. Opposite ends of the external terminals 16A to 16E are exposed in the frame of the resin case 13, and are electrically connected to electrodes and the like of the semiconductor chips 12 with conductive members, such as bonding wires or lead frames (not illustrated in the drawing).

Figure 3:
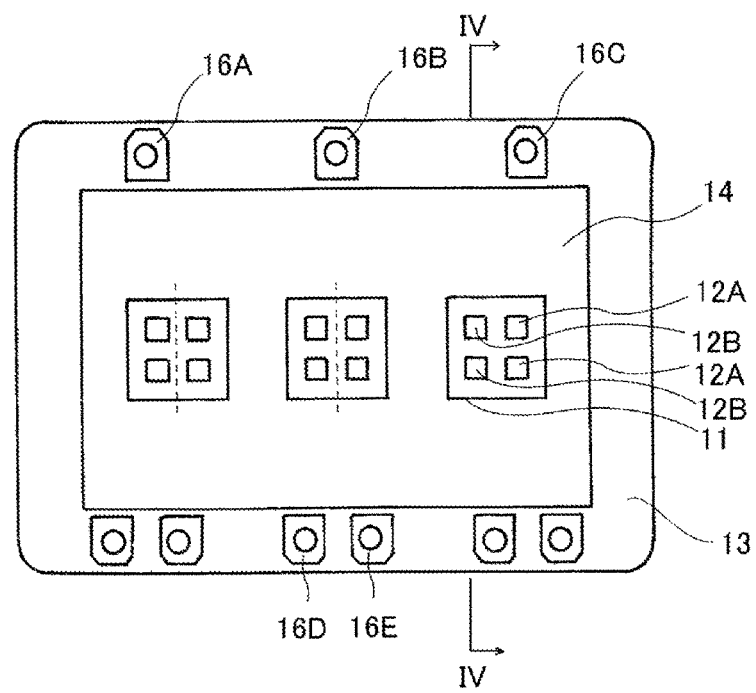
FIG. 3 is a plan view of the power semiconductor module 1 of FIG. 1.

FIG. 3 illustrates a plan view of the power semiconductor module 1 of FIG. 1. It is to be noted that, in the plan view, for facilitating understanding, a state where the insulating substrates 11 and the semiconductor chips 12 in the resin case 13 are exposed is illustrated by omitting illustration of a cover for covering the frame on the upper surface of the resin case 13, a sealing material to be injected into the frame, and the bonding wires. Among the four semiconductor chips 12 joined to one insulating substrate 11, two semiconductor chips 12A and two semiconductor chips 12B arranged in parallel along the short direction of the metal base plate 14 configure the upper arm and the lower arm, respectively. As described below, a cooling liquid flows in a direction parallel to the short direction of the metal base plate 14 just below the metal base plate 14. The semiconductor chips 12A and the semiconductor chips 12B are arranged in parallel in accordance with the flow direction of the cooling liquid, so that the cooling efficiency of the semiconductor chips 12A can be made to be the same as that of the semiconductor chips 12B.

The metal base plate 14 has rectangular front surface and rear surface, which are substantially the same or more in size as the resin case 13. The metal base plate 14 is made of metal having favorable thermal conductivity, such as copper, aluminum, or aluminum alloy, or a composite material (clad metal) of the metal and brazing filler metal. The insulating substrate 11 as a specific example of a laminate substrate is joined to the front surface of the metal base plate 14 with a joining material, for example, solder. Alternatively, joining with brazing filler metal as the joining material may be performed. In addition, in place of the joining material, thermal conductive grease can be interposed between the metal base plate 14 and the insulating substrate 11.

The cooling case 15 is also referred to as a cooling jacket. The cooling case 15 has a bottom wall 15a and a side wall 15b formed around the bottom wall 15a, and has an opening on an upper end. The upper end is joined to the metal base plate 14 by brazing, for example, so that an internal space surrounded by the metal base plate 14 and the cooling case 15 so as to prevent the cooling liquid from leaking is formed. Fins 17 as a heat sink are arranged in the internal space. A cooler 10 for cooling the semiconductor chips 12 includes the metal base plate 14, the cooling case 15, and the fins 17.

Figure 4:
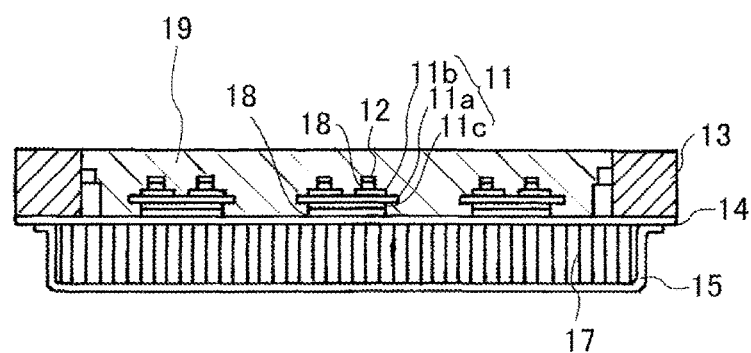
FIG. 4 is a cross-sectional view of the line IV-IV of FIG. 3.

FIG. 4 illustrates a cross-sectional view of the line IV-IV of FIG. 3. The insulating substrate 11 is obtained by pasting a ceramic insulating plate 11a, a circuit plate 11b made of copper foil or the like, which is selectively formed on a front surface of the ceramic insulating plate 11a, and a metal plate 11c made of copper foil or the like, which is formed on a rear surface of the ceramic insulating plate 11a. Joining of the circuit plate 11b and the semiconductor chip 12 is performed with solder 18 as the joining material, for example. Joining of the metal plate 11c and the metal base plate 14 is performed with the solder 18 as the joining material, for example. In place of the solder, a sintered material may be used. The insulating substrates 11 and the semiconductor chips 12 in the frame of the resin case 13 are sealed with a sealing material 19 made of an insulating resin, such as an epoxy resin, or an insulating gel, such as a silicone, thereby increasing the insulating property. It is to be noted that, in FIG. 4, illustration of the external terminals is omitted, and furthermore, illustration of wiring members, such as the bonding wires that electrically connect the electrodes formed on surfaces of the semiconductor chips 12 to the external terminals and the like is omitted. In addition, in FIG. 4, illustration of the cover attached to the upper surface of the resin case 13 is also omitted.

Figure 5:
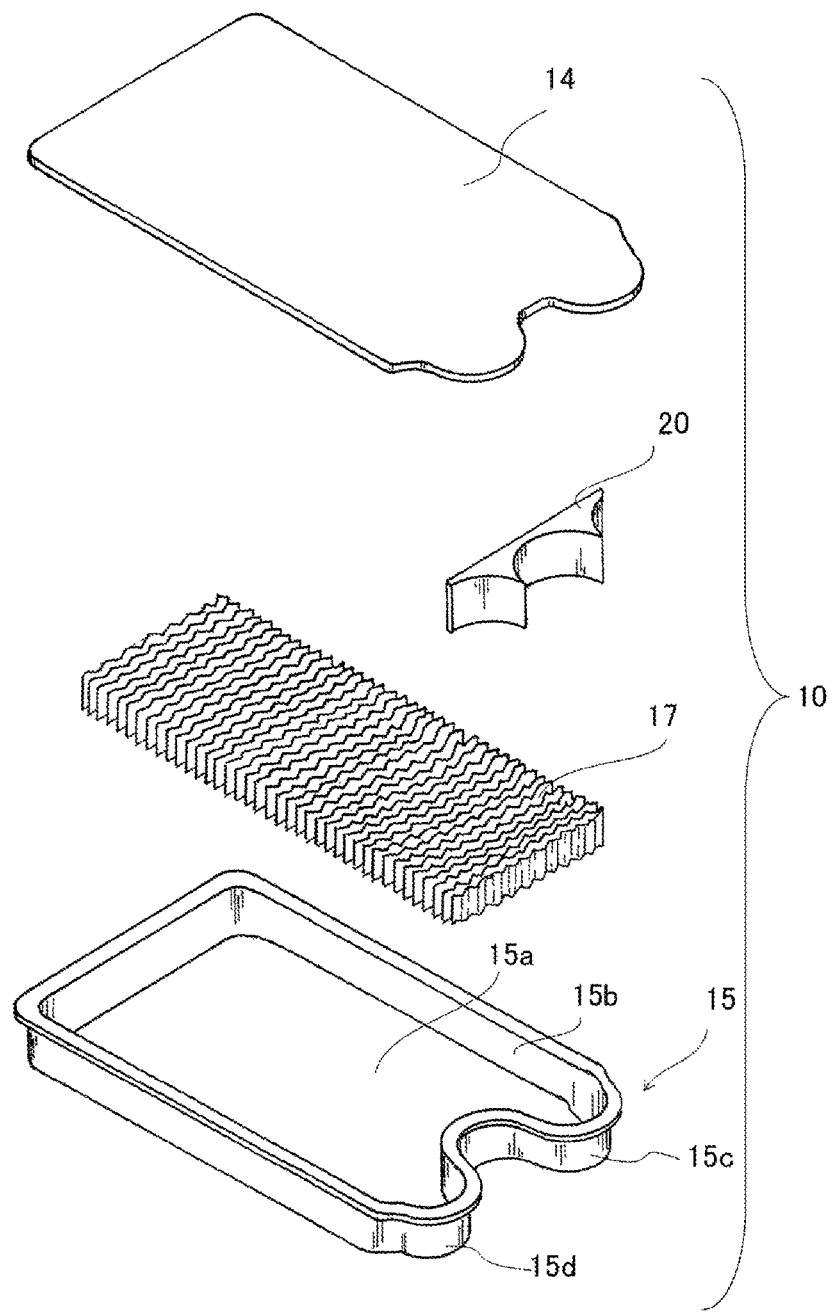
FIG. 5 is an exploded perspective view of a cooler.

FIG. 5 illustrates an exploded perspective view of the cooler 10. The fins 17 as a heat sink are housed in a substantially rectangular parallelepiped space surrounded by the bottom wall 15a and the side wall 15b of the cooling case 15. In the illustrated present embodiment, a plurality of fins 17 include a plurality of thin plates arranged in parallel with spaces therebetween so as to extend in a short direction of the cooling case 15. The illustrated fins 17 have wave shapes in the short direction of the metal base plate 14 and the cooling case 15 as viewed from above. The shape of the fins 17 is not limited to the illustrated example, and may be linear shapes. The fins 17 may have pin shapes, but the above-described wave-shaped or linear-shaped plate fins 17 are preferable. The fins 17 are made of metal having favorable thermal conductivity in the same manner as the metal base plate 14. An upper end of each of the fins 17 is joined to the rear surface of the metal base plate 14 by brazing. Accordingly, heat generated from the semiconductor chips 12 is conducted to the fins 17 through the insulating substrates 11 and the metal base plate 14. The heat sink as a whole has a substantially rectangular parallelepiped shape that can be housed in the cooling case 15.

The illustrated cooling case 15 has cooling-liquid inlet portion 15c and outlet portion 15d on both ends of one side (side wall) in the short direction. The inlet portion 15c and the outlet portion 15d have convex shapes protruding from the side wall of the cooling case 15 in the long direction. The inlet portion 15c has an inlet 15e on a bottom surface, and the outlet portion 15d has an outlet 15f on a bottom surface. For in-car power semiconductor modules for which downsizing, thinning, and lightening are required, it is preferable that the inlet portion 15c have the inlet 15e on the bottom surface and the outlet portion 15d have the outlet 15f on the bottom surface, in other words, the inlet 15e be formed on the bottom wall 15a and the outlet 15f be formed on the bottom wall 15a because the height of the cooling case 15 configuring the cooler 10 can be suppressed compared to the case where the inlet 15e and the outlet 15f are on the side wall.

The cooling case 15 is made of metal having favorable thermal conductivity in the same manner as the metal base plate 14 and the fins 17. It is preferable because the cooling case 15 is made of the same material as that of the metal base plate 14 and the fins 17, and thus, the stress and the distortion due to a difference in coefficient of thermal expansion can be suppressed. The cooling case 15 is molded by drawing.

A spacer 20 is arranged in the vicinity of the inlet portion 15c and the outlet portion 15d inside the cooling case 15, more specifically, between the side wall 15b in the vicinity of the inlet portion 15c and the outlet portion 15d, and the fins 17.

Figure 6:
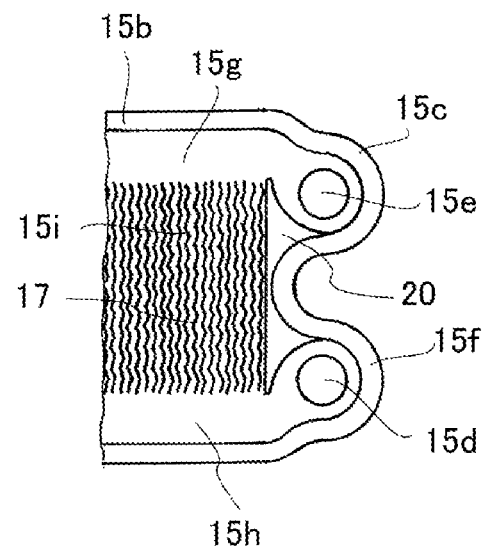
FIG. 6 is a plan view of the vicinity of an inlet portion and an outlet portion of the cooler.

FIG. 6 illustrates a plan view of the vicinity of the inlet portion 15c and the outlet portion 15d of the cooler 10. In the cooler 10, the inlet 15e of the inlet portion 15c and the outlet 15f of the outlet portion 15d are located nearer the center (inner side) in a short direction than an end part in the short direction of the fins 17. In a planar view, each opening of the inlet 15e and the outlet 15f intersects with an extended line of a long side of the heat sink. The cooler 10 has a first flow passage 15g for guiding the cooling liquid from the inlet 15e of the inlet portion 15c to the fins 17 along the side wall 15b in the long direction of the cooling case 15, a second flow passage 15h for guiding the cooling liquid to the outlet 15f of the outlet portion 15d on the opposite side of the first flow passage 15g and along the side wall 15b in the long direction of the cooling case 15, and a third flow passage 15i for cooling the fins 17 between the first flow passage 15g and the second flow passage 15h and between adjacent fins 17.

The thin plate-shaped fins 17 are arranged to extend in the short direction of the cooling case 15, so that the cooling liquid that has been guided from the inlet portion 15c flows in the third flow passage 15i between the fins 17 in the short direction of the cooling case 15 through the first flow passage 15g, and is discharged from the outlet 15f of the outlet portion 15d through the second flow passage 15h.

The spacer 20 is arranged adjacent to the fins 17 from the inlet portion 15c of the cooler 10 to a corner part of the fins 17, and guides the cooling liquid to the first flow passage 15g. In addition, the spacer 20 is arranged from the outlet portion 15d to a corner part of the fins 17, and guides the cooling liquid to the outlet portion 15d from the second flow passage 15h. The spacer 20 is made of metal having favorable thermal conductivity in the same manner as the metal base plate 14, the cooling case 15, and the fins 17. It is preferable because the spacer 20 is made of the same material as that of the metal base plate 14, the cooling case 15, and the fins 17, and thus, the stress and the distortion due to a difference in coefficient of thermal expansion can be suppressed. The spacer 20 is brazed to the metal base plate 14 and the cooling case 15.

The cooler 10 includes the spacer 20 between the convex-shaped inlet portion 15c and outlet portion 15d, so that, between the inlet 15e and the outlet 15f, a gap is filled, and the cooling liquid is prevented from directly flowing through a clearance between the side wall 15b and the fins 17, and furthermore, the shape of the spacer 20 is optimized, so that the cooling liquid between the inlet 15e and the fins 17 and the cooling liquid between the fins 17 and the outlet 15f can be made to flow smoothly. Therefore, by the spacer 20, the appropriate adjustment of the flow velocity distribution of the cooling liquid in the cooler 10 can be made easy, and the cooling performance can be improved. In addition, the spacer 20 has a large degree of freedom in design so as to have a shape corresponding to the shape of the cooling case 15, and thus, when manufacturing the cooling case 15, the side wall 15b in the vicinity of the inlet 15e and the outlet portion 15d of the cooling case 15 does not need to be located in the vicinity of the corner parts of the fins 17 by drawing having a high degree of processing. Therefore, the cooling case 15 can be downsized. In addition, a low degree of processing is enough for drawing, and thus, the number of dies of the drawing is small, and the manufacturing cost can be reduced. It is to be noted that, in the illustrated example, the inlet portion 15c and the outlet portion 15d respectively include substantially half cylinder side surfaces on the inside, and the spacer 20 includes arc-shaped side surfaces that continue from these side surfaces to the corner parts of the heat sink. The height of the spacer 20 may be the height of the fins 17 or less.

Figure 7:
FIGS. 7A-7C are illustration diagrams of modified examples of the shapes of a spacer.
Figure 7:
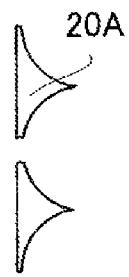
Figure 7:
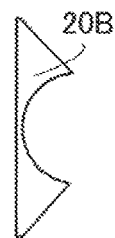

FIGS. 7A-7C illustrate modified examples of the spacer 20. The spacer is not limited to the spacer 20 having an integrated shape, illustrated in FIG. 6 and FIG. 7A, and may be a spacer 20A having a divided shape corresponding to the inlet portion 15c and the outlet portion 15d, respectively, as illustrated in FIG. 7B. In addition, the spacer may be a spacer 20B, in which parts facing the inlet portion 15c and the outlet portion 15d are planes having linear shapes as viewed from above, as illustrated in FIG. 7C.

Embodiment 2

A cooler of Embodiment 2 of the present invention will be described using FIGS. 8A and 8B. It is to be noted that a power semiconductor module using the cooler of FIGS. 8A and 8B can be the same as the power semiconductor module of Embodiment 1 regarding the insulating substrate, the semiconductor chip, the resin case, and the like.

Figure 8:
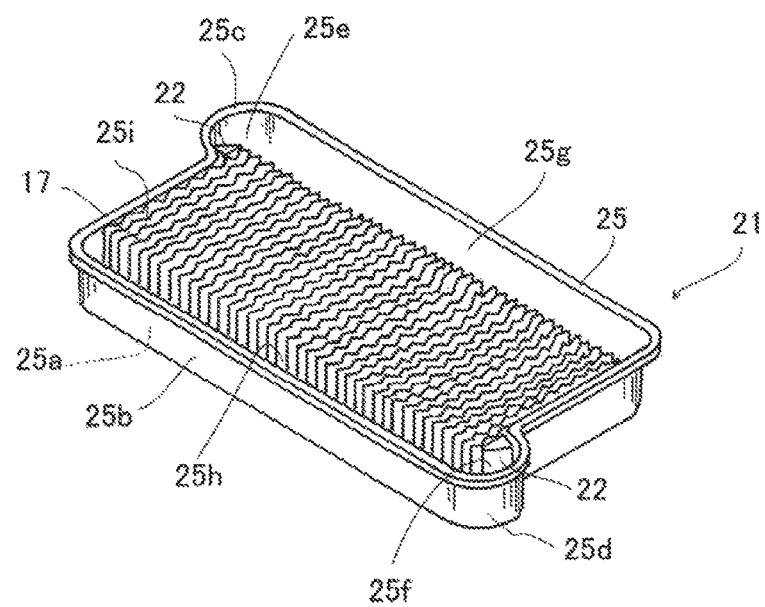
FIGS. 8A and 8B are illustration diagrams of a cooler of another embodiment of the present invention.
Figure 8:
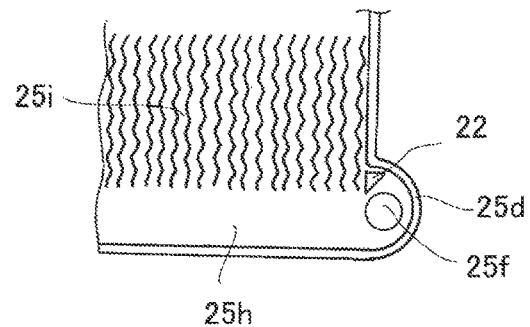
Figure 9:
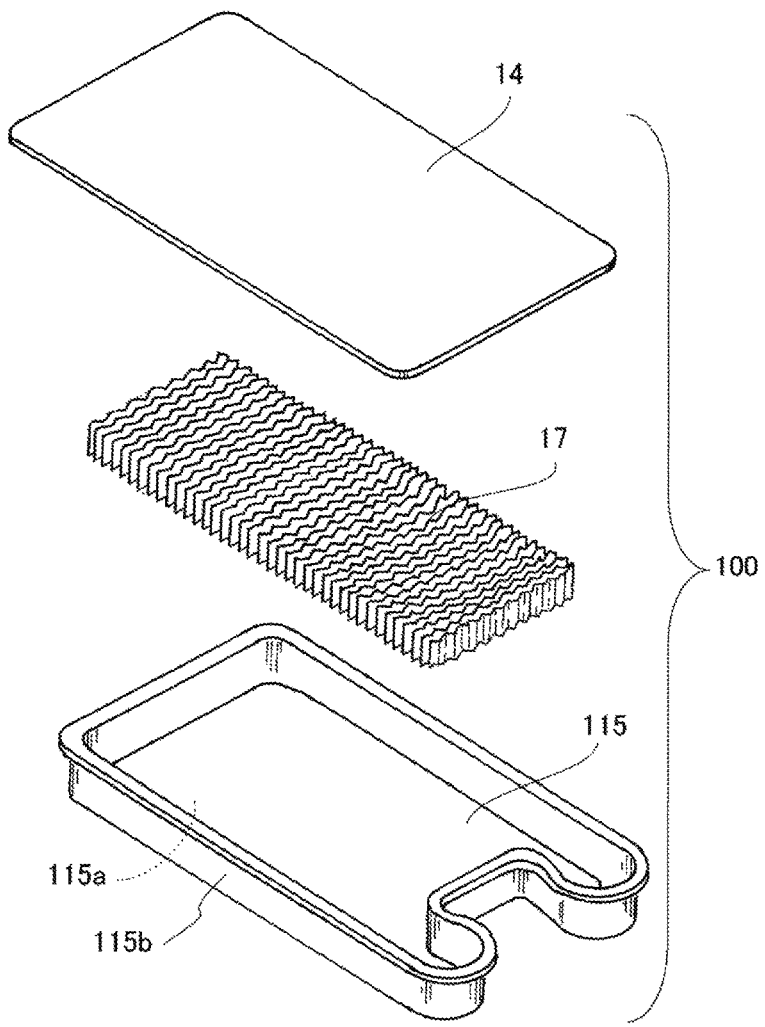
FIG. 9 is an exploded perspective view of a conventional cooler.

A cooler 21 illustrated in a perspective view of FIG. 8A is different from the cooler 10 illustrated in Embodiment 1 in an external shape of a cooling case 25. Specifically, the cooling case 25 has a bottom wall 25a and a side wall 25b formed around the bottom wall 25a, and has an opening on an upper end. The fins 17 are housed in a space surrounded by the bottom wall 25a and the side wall 25b. An inlet portion 25c and an outlet portion 25d are formed on corner parts on a substantially diagonal line of the cooling case 25. The inlet portion 25c has an inlet 25e on a bottom surface, and the outlet portion 25d has an outlet 25f on a bottom surface. The cooling case 25 is molded by drawing.

The cooler 21 includes a spacer 22 between the side wall 25b in the vicinity of the inlet portion 25c and the fins 17. In addition, the cooler 21 includes a spacer 22 between the side wall 25b in the vicinity of the outlet portion 25d and the fins 17. The spacers 22 are made of metal having favorable thermal conductivity in the same manner as the cooling case 25 and the fins 17. It is preferable because the spacers 22 are made of the same material as that of the cooling case 25 and the fins 17, and thus, the stress and the distortion due to a difference in coefficient of thermal expansion can be suppressed.

A plan view of the vicinity of the outlet portion 25d is illustrated in FIG. 8B. The spacer 22 has a planar (cross-sectional) shape of a substantially triangular shape, and has the same height as the fins 17. The same applies to the spacer 22 included in the vicinity of the inlet portion 25c. The spacer 22 is arranged adjacent to the fins 17 from the inlet portion 25c of the cooler 21 to a corner part of the fins 17, and guides the cooling liquid to a first flow passage 25g. In addition, the spacer 22 is arranged from the outlet portion 25d to a corner part of the fins 17, and guides the cooling liquid to the outlet portion 25d from a second flow passage 25h. Further, the cooler 21 has a third flow passage 25i for cooling the fins 17 between the first flow passage 25g and the second flow passage 25h and between adjacent fins 17.

The cooler 21 includes the spacers 22, so that, between the inlet 25e and the outlet 25f, the cooling liquid is prevented from flowing through a clearance between the side wall 25b and the fins 17 by the spacers 22, thereby capable of preventing a significant decrease in the cooling performance in the plane of the metal base plate 14. In addition, the cooling liquid between the inlet 25e and the fins 17 and the cooling liquid between the fins 17 and the outlet 25f can be made to flow smoothly by the spacers 22. Therefore, by the spacers 22, the appropriate adjustment of the flow velocity distribution of the cooling liquid in the cooler 21 can be made easy, and the cooling performance can be improved. In addition, the cooler 21 includes the spacers 22, so that, when manufacturing the cooling case 25, the side wall 25b in the vicinity of the inlet 25e and the outlet portion 25d of the cooling case 25 does not need to be located in the vicinity of the corner parts of the fins 17 by high-degree processing of drawing. Therefore, the cooling case 25 can be downsized, and furthermore, low-degree processing is enough for drawing, and thus, the number of dies of the drawing is small, and the manufacturing cost can be reduced.

As can be understood from Embodiment 1 to Embodiment 2, the spacer can be included regardless of the positions of the inlet portion and the outlet portion of the cooler. It is to be noted that, in both of the coolers illustrated in Embodiment 1 to Embodiment 2, the inlet and the outlet are formed on the bottom surface of the cooler, but the positions of the inlet and the outlet are not limited to the bottom surface of the cooler, and the inlet and the outlet may be formed on the side wall of the cooler. In addition, the positions of the inlet portion and the outlet portion of the cooler are not limited to those in the coolers illustrated in Embodiment 1 to Embodiment 2, and, for example, a cooler having the inlet portion and the outlet portion at the central part of one side of opposing sides in the long direction of the cooling case may be used.

Comparative Example

A conventional cooler will be described using FIG. 9 to FIG. 12 as a comparative example. A cooler 100 illustrated by an exploded perspective view in FIG. 9 includes the metal base plate 14, a cooling case 115 joined to the rear surface of the metal base plate 14, and the fins 17 as a heat sink, but does not include a spacer. The metal base plate 14 and the fins 17 are the same as those described above in Embodiment 1, and the detailed description is omitted. The cooling case 115 includes a bottom wall 115a and a side wall 115b, and has the approximately same shape and structure as those of the cooling case 15 of Embodiment 1.

Figure 10:
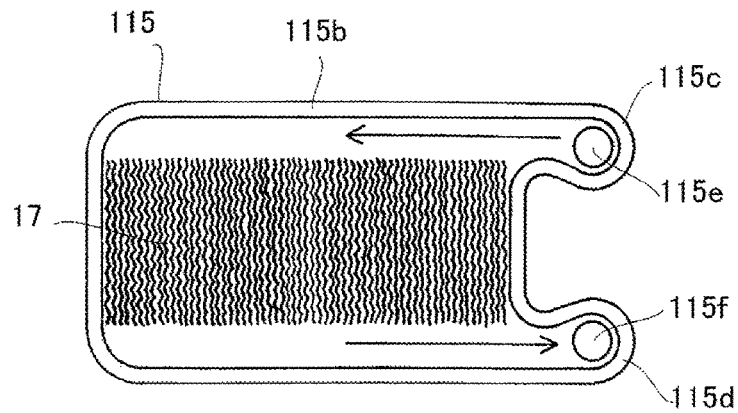
FIG. 10 is a plan view of the cooler of FIG. 9.
Figure 11:
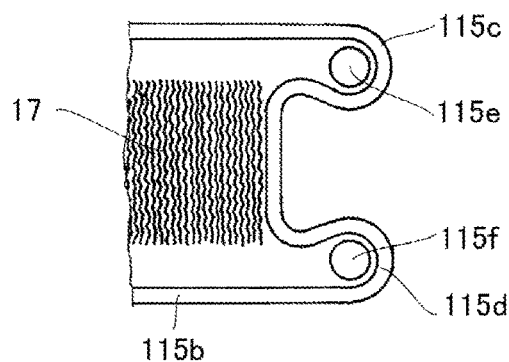
FIG. 11 is a partial plan view of the vicinity of an inlet portion and an outlet portion of the cooler of FIG. 9.

As illustrated by a plan view in FIG. 10, the cooling case 115 has an inlet portion 115c and an outlet portion 115d. The inlet portion 115c has an inlet 115e, and the outlet portion 115d has an outlet 115f. In the cooling case 115, the side wall 115b between the inlet portion 115c and the outlet portion 11d is a curved surface that approaches the fins 17. As illustrated in a partial plan view of the vicinity of the inlet portion 115c and the outlet portion 115d in FIG. 11, the side wall 115b between the inlet portion 115c and the outlet portion 115d is manufactured by drawing, and thus, in order to form the curved surface that approaches the fins 17, drawing having a high degree of processing was needed during manufacture. Thus, the number of dies for the drawing needed to be large, thereby causing an increase in the manufacturing cost.

Figure 12:
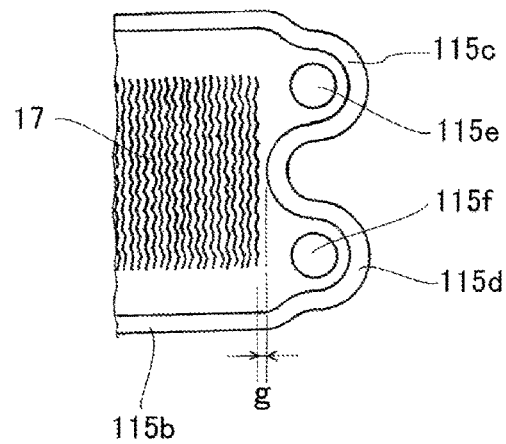
FIG. 12 is a partial plan view of the vicinity of the inlet portion and the outlet portion of the conventional cooler.

FIG. 12 illustrates a partial plan view of the vicinity of the inlet portion 115c and the outlet portion 115d of the cooler in which the side wall 115b between the inlet portion 115c and the outlet portion 115d is manufactured by drawing having a low degree of processing. Since the side wall 115b between the inlet portion 115c and the outlet portion 115d was manufactured by the drawing having a low degree of processing in the cooler illustrated in FIG. 12, a gap g between the fins 17 and the side wall 115b was large, the cooling liquid directly flowed from the inlet portion 115c to the outlet portion 115d through the gap g, and the pressure distribution of the cooling liquid in the cooler 100 was disturbed, thereby decreasing the cooling performance.

The effects of the cooler 10 of Embodiment 1 are apparent from a contrast between the cooler 10 illustrated in FIG. 5 to FIG. 6 of Embodiment 1 and the conventional cooler 100 illustrated in FIG. 9 to FIG. 12. Specifically, the gap between the fins 17 and the side wall 15b is filled with the spacer 20, and thus, even when the side wall 15b between the inlet portion 15c and the outlet portion 15d is manufactured by drawing having a low degree of processing, the pressure distribution of the cooling liquid can be maintained in a favorable state. In addition, since manufacturing can be attained by the drawing having a low degree of processing, the manufacturing cost can be reduced.

While the embodiments of the power semiconductor module and the like of the present invention have been described above using the drawings, it goes without saying that the power semiconductor module and the like of the present invention are not limited to the description of the respective embodiments and the drawings and that a large number of modifications can be made without departing from the gist of the present invention.

DESCRIPTION OF SYMBOLS 1 power semiconductor module
10, 21 cooler
11 insulating substrate
12 semiconductor chip (semiconductor element)
13 resin case
14 metal base plate
15, 25 cooling case
15a, 25a bottom wall
15b, 25b side wall
15c, 25c inlet portion
15d, 25d outlet portion
15e, 25e inlet
15f, 25f outlet
17 fin (heat sink)
20, 22 spacer

The invention claimed is:
1. A power semiconductor module comprising:
a laminate substrate;
a semiconductor element joined to a front surface of the laminate substrate;
a base plate joined to a rear surface of the laminate substrate;
a cooling case which has a bottom wall and a side wall formed around the bottom wall, and has an inlet portion and an outlet portion for a cooling-liquid which are connected to either the bottom wall or the side wall, in which one end of the side wall is joined to a rear surface of the base plate such that a cooling liquid can flow into a space surrounded by the base plate, the bottom wall, and the side wall;
a heat sink housed in the cooling case; and
a spacer arranged between the inlet portion and the outlet portion of the cooling case and substantially completely filling a space between the heat sink and the side wall, wherein the spacer is brazed to the base plate and the cooling case.

2. The power semiconductor module according to claim 1, wherein
the spacer is arranged between the side wall in a vicinity of at least one of the inlet portion and the outlet portion, and the heat sink.

3. The power semiconductor module according to claim 2, wherein
the spacer is arranged adjacent to the heat sink from at least one of the inlet portion and the outlet portion to a corner part of the heat sink.

4. The power semiconductor module according to claim 1, wherein
the cooling case is manufactured by drawing.

5. The power semiconductor module according to claim 1, wherein
the heat sink is made of a wave-shaped or linear-shaped thin plate.

6. The power semiconductor module according to claim 1, wherein
the inlet portion has an inlet on a bottom surface, and the outlet portion has an outlet on a bottom surface.

7. The power semiconductor module according to claim 1, wherein
the cooling case has the inlet portion and the outlet portion on both ends of one side in a short direction of the cooling case.

8. The power semiconductor module according to claim 1, wherein
the cooling case has the inlet portion and the outlet portion on corner parts on a substantially diagonal line of the cooling case.

9. The power semiconductor module according to claim 1, wherein
the cooling case has the inlet portion and the outlet portion at central parts of opposing sides in a long direction of the cooling case.

10. A power semiconductor module comprising:
a laminate substrate;
a semiconductor element joined to a front surface of the laminate substrate;
a base plate joined to a rear surface of the laminate substrate;
a cooling case which has a bottom wall and a side wall formed around the bottom wall, and has an inlet portion and an outlet portion for a cooling-liquid which are connected to either the bottom wall or the side wall, in which one end of the side wall is joined to a rear surface of the base plate such that a cooling liquid can flow into a space surrounded by the base plate, the bottom wall, and the side wall;
a heat sink housed in the cooling case; and
a spacer arranged between the inlet portion and the outlet portion of the cooling case and substantially completely filling a space between the heat sink and the side wall, wherein the spacer is made of a same material as that of the base plate and the cooling case.

11. A power semiconductor module comprising:
a laminate substrate;

a semiconductor element joined to a front surface of the laminate substrate;

a base plate joined to a rear surface of the laminate substrate;

a cooling case which has a bottom wall and a side wall formed around the bottom wall, and has an inlet portion and an outlet portion for a cooling-liquid formed in the side wall, in which one end of the side wall is joined to a rear surface of the base plate such that a cooling liquid can flow into a space surrounded by the base plate, the bottom wall, and the side wall;

a heat sink housed in the cooling case; and spacers each being arranged adjacent to the inlet portion and the outlet portion of the cooling case, wherein each of the inlet portion and the outlet portion includes a substantially half cylinder side surface on an inside of the side wall, and each of the spacers is formed separately from the cooling case and defines the inlet portion or the outlet portion such that a side surface of the spacer substantially continues from a side surface of the inlet portion or the outlet portion to a corner part of the heat sink.

12. The power semiconductor module according to claim 11, wherein the cooling case has a rectangular shape with the inlet portion and the outlet portion on one side in a short direction of the cooling case such that the inlet portion and the outlet portion protrude outwardly from the one side.

13. The power semiconductor module according to claim 12, wherein the heat sink comprises fins having a width facing the inlet portion and the outlet portion, the width being substantially same as a width of the spacer facing the heat sink, and the spacer has a shape facing the side wall between the inlet portion and the outlet portion, the shape being substantially same as a shape of the side wall facing the spacer.

14. A cooler comprising:

a base plate joined to a rear surface of a laminate substrate;

a cooling case which has a bottom wall and a side wall formed around the bottom wall, and has an inlet portion and an outlet portion for a cooling-liquid formed in the side wall, in which one end of the side wall is joined to a rear surface of the base plate such that a cooling liquid can flow into a space surrounded by the base plate, the bottom wall, and the side wall;

a heat sink housed in the cooling case; and spacers each being arranged adjacent to the inlet portion and the outlet portion of the cooling case, wherein each of the inlet portion and the outlet portion includes a substantially half cylinder side surface on an inside of the side wall, and each of the spacers is formed separately from the cooling case and defines the inlet portion or the outlet portion such that a side surface of the spacer substantially continues from a side surface of the inlet portion or the outlet portion to a corner part of the heat sink.

15. The cooler according to claim 14, wherein the cooling case has a rectangular shape with the inlet portion and the outlet portion on one side in a short direction of the cooling case such that the inlet portion and the outlet portion protrude outwardly from the one side.

16. The cooler according to claim 15, wherein the heat sink comprises fins having a width facing the inlet portion and the outlet portion, the width being substantially same as a width of the spacer facing the heat sink, and the spacer has a shape facing the side wall between the inlet portion and the outlet portion, the shape being substantially same as a shape of the side wall facing the spacer.

* * * * *